United States Patent [19]
Berg

[11] Patent Number: 5,653,893
[45] Date of Patent: Aug. 5, 1997

[54] METHOD OF FORMING THROUGH-HOLES IN PRINTED WIRING BOARD SUBSTRATES

[76] Inventor: N. Edward Berg, 43 Smith Rd., Bedford, N.H. 03110

[21] Appl. No.: 493,965

[22] Filed: Jun. 23, 1995

[51] Int. Cl.⁶ ............................................. H05K 3/00
[52] U.S. Cl. .................. 216/18; 216/17; 216/83; 216/92
[58] Field of Search .................. 216/17, 18, 39, 216/56, 83, 92

[56] References Cited

U.S. PATENT DOCUMENTS

| | | | |
|---|---|---|---|
| 4,155,775 | 5/1979 | Alpaugh et al. ............ | 216/17 X |
| 4,431,478 | 2/1984 | Yamaoka et al. ........... | 216/83 |
| 4,911,796 | 3/1990 | Reed ........................... | 204/15 |
| 4,964,948 | 10/1990 | Reed ........................... | 156/659.1 |
| 5,236,772 | 8/1993 | Horikoshi et al. .......... | 428/209 |
| 5,311,660 | 5/1994 | Alpaugh et al. ............ | 216/18 X |
| 5,346,597 | 9/1994 | Lee et al. .................... | 204/129.1 |
| 5,352,325 | 10/1994 | Kato ............................ | 156/644 |

*Primary Examiner*—Thi Dang
*Attorney, Agent, or Firm*—Hayes, Soloway, Hennessey, Grossman & Hage, P.C.

[57] ABSTRACT

Through-holes are formed in a printed circuit board substrate by chemical etching a metal foil clad circuit board having open positions in the metal foil where a hole is to be formed using N-methyl-2-pyrrolidone, a mixture of methylene chloride and HF, or a mixture of methylene chloride, HF and xylene.

10 Claims, 3 Drawing Sheets

METHOD OF FORMING THROUGH-HOLES IN PRINTED WIRING BOARD SUBSTRATES

BACKGROUND OF THE INVENTION

The present invention relates to a method of forming through-holes in printed wiring board substrates; and more particularly to the formulation of micro through-holes in the same accurately and effectively by means of a chemical etching process.

Conventional methods of forming through-holes in printed wiring boards employ mechanical drilling, laser drilling and plasma etching among others.

Regarding mechanical drilling, it is very difficult to form micro through-holes of 100 microns or less due to the difficulty in producing drills of that size that do not readily break. Also, even using a drill size of 250 microns it takes 4–6 hours to drill 10,000 holes, an inordinate amount of time. Further, mechanical drilling creates burrs, dust and debris that often block the holes or adhere to the surface of the substrate material requiring additional cleaning process. If the substrate is clad with a metal, the metal is smeared into the hole. And, the drilling apparatus required is very expensive and additional expendables such as entry and back-up boards also add to cost.

Laser drilling and plasma drilling processes are incapable of forming holes in substrate materials containing glass fibers which disallows use of the most widely used and inexpensive substrates which normally do contain glass fibers. In addition, equipment to perform laser or plasma drill is also very costly.

The foregoing discussion of the prior art is taken largely from U.S. Pat. No. 5,352,325 to Kato who proposes forming micro through-holes in circuit boards by selectively dissolving or etching using alkaline potassium permanganate in the case of a circuit board material not containing glass fibers, and using fluoride chemicals in the case of a board material containing glass fibers. According to Kato, a printed wiring board substrate, consisting of a insulative layer (usually composed of resinous material with or without glass fiber reinforcement) covered on both sides with a conductive layer, is covered with an etching resist except for specified locations where holes are to be formed; a selected chemical etchant is brought into contact with said surfaces and selectively dissolves the exposed parts of the conductor layer; the previously applied etching resist is removed; the conductor surface is then exposed to a strong alkaline solution and a solvent which softens the exposed areas of the insulative core material where holes are to be opened; the surface is then brought into contact with either alkaline potassium permanganate, concentrated sulfuric acid, chromate or similar solution, under agitation whereby to selectively remove by chemical dissolution the exposed resin core material; this treatment is interrupted by acidic washing followed by a neutralizing solution wash. The substrate is then exposed to a fluoride-containing solution under agitation which dissolves the glass fibers, thus completing the etching process and forming the micro through-holes. Finally, the through-holes are plated to provide electrical interconnection between the conductive layers on both sides of the board.

Using the aforedescribed method, Kato reports that it is possible to precisely determine the exact size, shape and location of through-holes. While the method disclosed by Kato may achieve certain of his stated advantages, it is believed that the Kato method has not achieved any degree of commercial success due to its complexity and the need to employ multiple solvents and solvent application steps which dramatically increases manufacturing time and cost. Moreover, the use of multiple solvents and solvent application steps increases disposal costs, i.e. of spent solvents.

OBJECTS OF THE INVENTION

It is therefore general object of the present invention to provide a method for forming through-holes in a printed wiring board substrate which overcomes the aforesaid and other disadvantages of the prior art. A more specific object of the present invention is to provide a simplified method of forming through-holes in printing wiring board substrates by chemical etching.

SUMMARY OF THE INVENTION

The present invention provides a method for forming through-holes in printed wiring board substrates in which a foil-clad circuit board substrate is covered with a patterned mask having holes in predetermined positions where through-holes are intended to be formed. The exposed portions of the foil are removed by a conventional etchant, whereby to expose portions of the substrate board where holes are to be formed. Thereafter, a solvent selected from NMP (N-methyl-2-pyrrolidone), or a mixture of methylene chloride and HF alone or in combination with xylene is sprayed on to the board. The board may be sprayed one side at a time, or both sides sprayed simultaneously. The foil acts as a mask so that the solvent etches the board only in the areas exposed through openings in the foil, whereby to form the desired through-holes. The holes are then plated through by conventional electrolytic or electrolysis plating techniques, using one of the foils as a ground plane in the plating process. Finally, circuits are formed on the foils by conventional additive or subtractive methods.

Still other features and advantages of the present invention will become clear from the following detailed description of the invention, taking in conjunction with the attached drawings, in which like numerals represent like parts, and wherein:

FIG. 1 is a block flow diagram illustrating one preferred embodiment of the method of the present invention; and FIGS. 2–6 are diagrammatic cross-sections of a printed wiring board at various stages according to the process of the present invention as illustrated in FIG. 1.

While the present invention will hereinafter be described in connection with preferred embodiments, it will be appreciated that it is not intended to be limited to those embodiments. On the contrary, the present invention is intended to cover all such alternatives, modifications and equivalents as may be included within the spirit and scope of the invention as defined only by the hereinafter amended claims.

DETAILED DESCRIPTION OF PREFERRED EMBODIMENT

Figure 1:
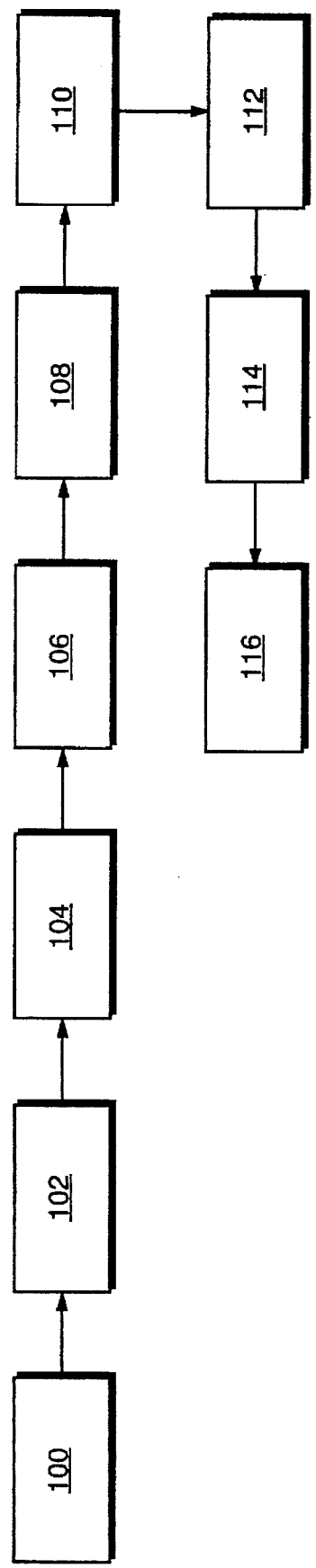
Figure 2:
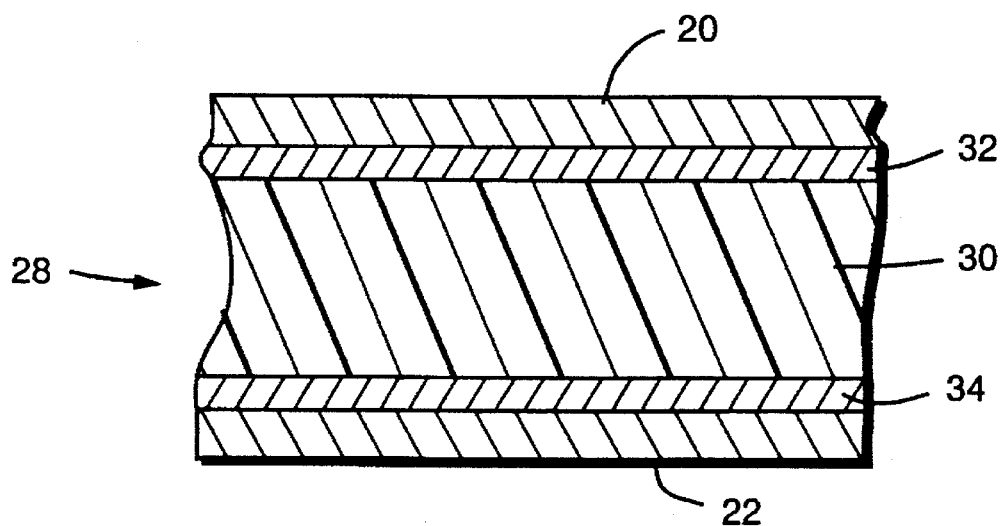

Referring to FIGS. 1 and 2 of the drawings, the method begins by applying resist layers 20, 22 on opposite surfaces of a foil-coated circuit board 28 at a station 100. Circuit board 28 comprises a conventional insulative substrate 30 having metallic, e.g. copper foils 32, 34 clad onto opposite surfaces of the substrate 30. Substrate 30 comprises a conventional circuit board insulative substrate and may be formed, for example, of a glass-reinforced epoxy in the case of a rigid substrate, or may be formed of a flexible polymeric material such as Kapton, in the case of a flexible circuit.

Figure 3:
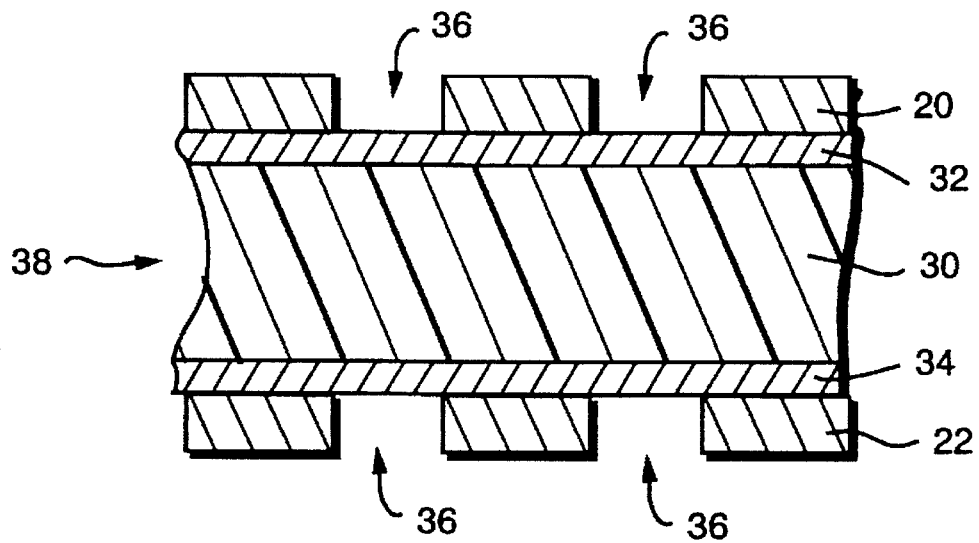
Figure 4:
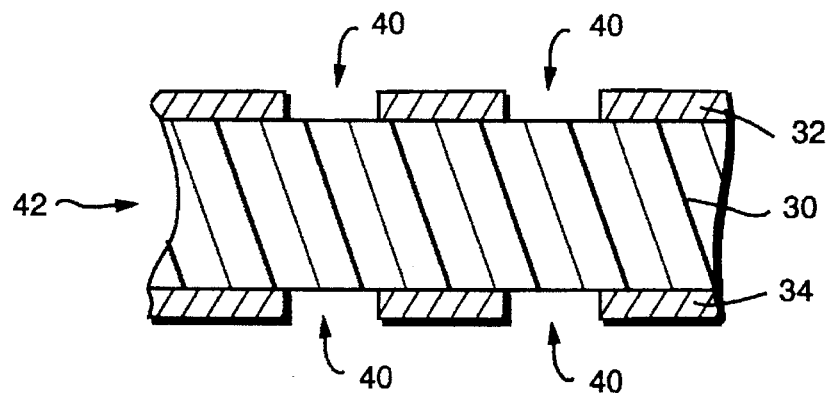

Resist layers 20, 22 are patterned, developed and portions removed, in conventional manner, at stations 102, 104 and 106 where through-holes 36 (see FIG. 3) are intended to be formed. The resulting patterned resist-coated board 38 is then exposed to a suitable etchant such as ferric chloride at an etching station 108 which dissolves the exposed portions of the copper foil whereby to form openings 40 (see FIG. 4) in the foil where through-holes are to be formed in the board substrate.

The resist layers 20, 22 are then stripped in station 110 in a conventional manner, and the resulting foil-covered board 42 is subjected to a solvent etching step in station 112 using a selected solvent wherein those portions of the substrate 30 exposed in openings 40 are removed by chemical etching. In accordance with the present invention, I have discovered several solvent systems which advantageously may be used for chemically etching through the insulative substrate. These include NMP (N-methyl-2-pyrrolidone), and methylene chloride containing HF alone or in combination with xylene. In the case of the methylene chloride-containing solvent system, the methylene chloride should be present in a range of from 20 to 80 volume percent, preferably 40 to 60 volume percent, while the xylene should be present in an amount up to about 10 volume percent. Any of the aforesaid solvent systems may be used to dissolve the polymeric base material forming the insulative substrate, although only the HF-containing solvent dissolves both the polymeric material and the glass fibers. However, inasmuch as the glass fibers are found not to interfere with the subsequent plating through step (described below), any one of the aforesaid solvent systems advantageously may be used in accordance with the present invention.

Figure 5:
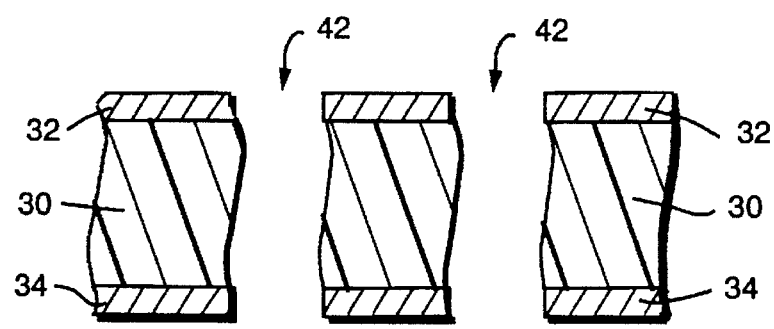

In order to speed the etching step, the etchants preferrably are heated and sprayed onto the circuit board. Spraying may be performed from one side at a time, or simultaneously against both sides of the board. Once etch-through 42 (FIG. 5) has occurred, the board may then be washed using water, if desired, including an acid neutralizing material such as sodium bicarbonate. If desired, detritus may be removed from the through-holes by means of compressed air, or by flooding one or both surfaces of the board with a defocused laser or using a gas flame such as natural gas.

Figure 6:
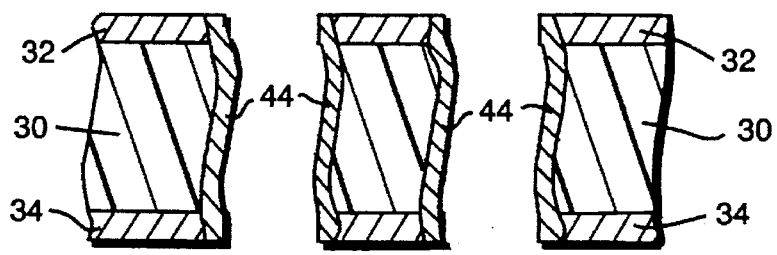

The next step of the process involves plating through the holes formed in the insulative substrate 30. Plating may be accomplished using conventional electrolytic or electro-less plating at a plating station 114. One of the foil layers 30, 32 may be employed as a continuous ground plane to facilitate the plating process. As mentioned supra, in the case of a glass reinforced substrate, it is not necessary that the holes be completely cleared of all glass fiber. The only requirement is that at least some of the hole runs completely through the substrate so that plating 44 (FIG. 6) between the foil layers 32, 34 will be continuous.

Following the plating step, the circuits are then formed on foils 32, 34 using conventional additive and/or subtractive methods at station 116.

Using the methods herein described, it is possible to accurately place and form through-holes of 50 microns or less, and further possibly to reduce the needed land diameter. Accordingly, the pattern density of a printed circuit board made in accordance with the present invention can be increased two to three or more times compared to those achievable for conventional mechanical drilling. Also, using the method described herein, it is possible to process the opening of micro through-holes in the printed circuit board at a rate of five to ten times faster than that which could be accomplished using conventional mechanical drilling processes. Moreover, the method of the present invention advantageously can be employed with substrate board containing glass fibers, whereas plasma etching or laser drilling cannot. Yet another advantage of the present invention is that the equipment necessary for implementing the process costs but a fraction of the equipment necessary for plasma or laser micro through-holes technologies.

I claim:

1. In a process for forming through-holes in a printed circuit board substrate in which a metal foil clad circuit board having open positions in the metal foil where a hole is to be formed is subjected to a chemical etch, the improvement which comprising chemically etching through the substrate board by means of a chemical etchant selected from the group consisting of a mixture of methylene chloride and HF, and a mixture of methylene chloride, HF and xylene.

2. In a method according to claim 1, wherein said chemical etchant is sprayed onto the board.

3. In a method according to claim 1, wherein the methylene chloride is present in a range of from 20–80 volume percent.

4. In a method according to claim 1, wherein the methylene chloride is present in a range of from 40–60 volume percent.

5. In a method according to claim 1, and including the step of plating through the resulting holes, using the metal foil as a ground plane.

6. In a method according to claim 1, and including clearing the through-holes of any detritus using compressed air.

7. In a method according to claim 1, and including clearing the through-holes of any detritus by flooding the board substrate with a defocused laser.

8. In a method according to claim 1, wherein the xylene is present in an amount of up to about 10 volume percent.

9. In a method according to claim 1, wherein the chemical etchant is heated.

10. In a method according to claim 1, and including the step of subjecting the board substrate to a flame treatment.

* * * * *